(12) United States Patent
Nishikage et al.

(10) Patent No.: US 11,626,301 B2
(45) Date of Patent: Apr. 11, 2023

(54) METHOD FOR MANUFACTURING SEMICONDUCTOR ELEMENT

(71) Applicant: NICHIA CORPORATION, Anan (JP)

(72) Inventors: Haruhiko Nishikage, Anan (JP);
Yoshinori Miyamoto, Tokushima (JP);
Yasunobu Hosokawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 206 days.

(21) Appl. No.: 17/009,166

(22) Filed: Sep. 1, 2020

(65) Prior Publication Data

US 2021/0090914 A1 Mar. 25, 2021

(30) Foreign Application Priority Data

Sep. 24, 2019 (JP) .............................. JP2019-173056

(51) Int. Cl.
*H01L 21/67* (2006.01)
*H01L 21/78* (2006.01)

(52) U.S. Cl.
CPC ........ *H01L 21/67092* (2013.01); *H01L 21/78* (2013.01); *H01L 2221/6834* (2013.01); *H01L 2221/68372* (2013.01)

(58) Field of Classification Search
CPC ............... H01L 21/0254; H01L 33/007; H01L 33/0075; H01L 33/32; H01L 21/02002; H01L 21/020008; H01L 21/0201; H01L 21/02013; H01L 21/02021; C30B 29/403; B24B 9/065

See application file for complete search history.

(56) References Cited

U.S. PATENT DOCUMENTS

| 2009/0057841 | A1 | 3/2009 | Sekiya |
| 2009/0203167 | A1 | 8/2009 | Mitani |
| 2012/0100785 | A1 | 4/2012 | Ishimasa et al. |
| 2012/0187547 | A1 | 7/2012 | Nemoto et al. |
| 2013/0022773 | A1 | 1/2013 | Aida et al. |
| 2013/0087807 | A1 | 4/2013 | Ikuta et al. |
| 2015/0349203 | A1* | 12/2015 | Shimooka ............. H01L 33/007 438/46 |

FOREIGN PATENT DOCUMENTS

| JP | 2000-331940 A | 11/2000 |
| JP | 2007-081131 A | 3/2007 |

(Continued)

*Primary Examiner* — Julio J Maldonado
*Assistant Examiner* — Stanetta D Isaac
(74) *Attorney, Agent, or Firm* — Foley & Lardner LLP

(57) ABSTRACT

A method for manufacturing a semiconductor element includes: providing a wafer comprising first and second regions at an upper surface of the wafer, the second region being located at a periphery of the first region and being at a lower position than the first region; and forming a semiconductor layer made of a nitride semiconductor at the upper surface of the wafer. In a top-view, the first region comprises an extension portion at an end portion of the first region in a first direction that passes through the center of the wafer parallel to an m-axis of the semiconductor layer, the extension portion extending in a direction from a center of the wafer toward an edge of the wafer or in a direction from an edge of the wafer toward a center of the wafer.

20 Claims, 10 Drawing Sheets

(56) References Cited

FOREIGN PATENT DOCUMENTS

| | | | |
|---|---|---|---|
| JP | 2007-165769 | A | 6/2007 |
| JP | 2008-177348 | A | 7/2008 |
| JP | 2008-290919 | A | 12/2008 |
| JP | 2009-064801 | A | 3/2009 |
| JP | 2010-245167 | A | 10/2010 |
| JP | 2010-247273 | A | 11/2010 |
| JP | 2011-235406 | A | 11/2011 |
| JP | 2012-006830 | A | 1/2012 |
| JP | 2012-156246 | A | 8/2012 |
| JP | 2013-173641 | A | 9/2013 |
| JP | 2014-093369 | A | 5/2014 |
| JP | 2014-093513 | A | 5/2014 |
| JP | 2014-117782 | A | 6/2014 |
| JP | 2014-120648 | A | 6/2014 |
| JP | 2014-139964 | A | 7/2014 |
| JP | 2016-051779 | A | 4/2016 |
| JP | 2016-052984 | A | 4/2016 |
| JP | 2017-059586 | A | 3/2017 |
| JP | 2017-069489 | A | 4/2017 |
| JP | 2017-069507 | A | 4/2017 |
| WO | WO-2011/161975 | A1 | 12/2011 |

\* cited by examiner

METHOD FOR MANUFACTURING SEMICONDUCTOR ELEMENT

CROSS-REFERENCE TO RELATED APPLICATION

This application is based upon and claims priority to Japanese Patent Application No. 2019-173056, filed on Sep. 24, 2019, the entire contents of which are incorporated herein by reference.

FIELD

Present disclosure relate to a method for manufacturing a semiconductor element.

BACKGROUND

For example, PCT Patent Publication No. WO2011/161975 discusses one method for manufacturing a semiconductor element such as a light-emitting diode (LED) or the like in which a semiconductor layer is grown on a wafer, which is a growth substrate such as a sapphire substrate or the like, and the wafer is subsequently bonded to a support substrate. In such a method for manufacturing a semiconductor element, there are cases in which cracks occur in the semiconductor layer when growing the semiconductor layer. Also, there are cases in which the yield of the method for manufacturing the semiconductor element is reduced by a loss of flatness of the upper surface of the semiconductor layer.

SUMMARY

According to certain embodiments of the present disclosure, which was conceived in consideration of the problems described above, a method for manufacturing a semiconductor element is provided in which the yield can be increased by making the upper surface of a semiconductor layer flatter while reducing the effects of cracks occurring in the semiconductor layer.

A method for manufacturing a semiconductor element according to one embodiment of the present disclosure includes: a process of providing a wafer including first and second regions in an upper surface of the wafer, in which the second region is provided at a periphery of the first region and is at a lower position than the first region; and a process of forming a semiconductor layer made of a nitride semiconductor at the upper surface of the wafer. In a top-view, the first region includes an extension portion at an end portion of the first region in a first direction; the extension portion extends in a direction from a center of the wafer toward an edge of the wafer; and the first direction passes through the center of the wafer parallel to an m-axis of the semiconductor layer. The extension portion includes a first side surface parallel to a third direction tilted at an angle not less than 5° and not more than 55° with respect to a second direction, and the second direction is parallel to a tangent at an edge of the wafer in the first direction.

A method for manufacturing a semiconductor element according to a certain embodiment of the present disclosure includes: a process of providing a wafer including first and second regions in an upper surface of the wafer, in which the second region is provided at a periphery of the first region and is at a lower position than the first region; and a process of forming a semiconductor layer made of a nitride semiconductor at the upper surface of the wafer. In a top-view, the second region includes an extension portion at an end portion of the second region in a first direction; the extension portion extends in a direction from an edge of the wafer toward a center of the wafer; and the first direction passes through the center of the wafer parallel to an m-axis of the semiconductor layer. The extension portion includes a first side surface parallel to a third direction tilted at an angle not less than 5° and not more than 55° with respect to a second direction, and the second direction is parallel to a tangent at an edge of the wafer in the first direction.

According to the certain embodiment of the present disclosure, a method for manufacturing a semiconductor element can be realized in which the yield can be increased by making the upper surface of a semiconductor layer flatter while reducing the effects of cracks occurring in the semiconductor layer.

DETAILED DESCRIPTION

Figure 1:
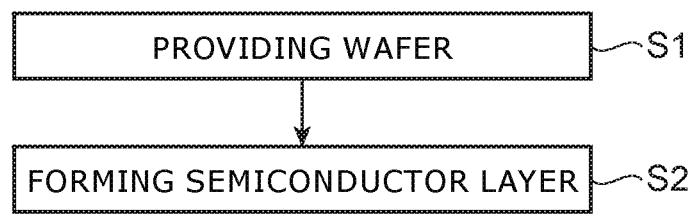
FIG. 1 is a flowchart showing a method for manufacturing a semiconductor element according to a first embodiment.

Embodiments of the present disclosure are described below with reference to the drawings. The drawings are schematic and conceptual, and have enhancements and omissions as appropriate for easier viewing of the drawings. The configurations, dimensional ratios, etc., of the portions shown in the drawings are not necessarily the same as the actual values. There are also cases in which the dimensional ratios, configurations, etc., of the portions do not strictly match between the drawings. In the following description, the same reference numerals are used for antecedent components, and a detailed description is omitted.

First Embodiment

First, a method for manufacturing a semiconductor element according to a first embodiment of the present disclosure will be described.

The method for manufacturing the semiconductor element according to the first embodiment includes a process of providing a wafer 10 (step S1) and a process of forming a semiconductor layer 20 made of a nitride semiconductor on the wafer 10 (step S2).

An upper surface 15 of the wafer 10 includes a first region 11, and a second region 12 provided at the periphery of the first region 11 at a lower position than the first region 11. In a top view of the wafer 10, the first region 11 includes an extension portion 11b at an end portion of the first region 11 in a first direction V1, which passes through a center C of the wafer 10 parallel to an m-axis of the semiconductor layer 20, and the extension portion 11b extends in a direction from the center C of the wafer 10 toward an edge 17 of the wafer 10. The extension portion 11b includes a first side surface 11c parallel to a third direction V3 tilted at an angle θ1 that is not less than 5° and not more than 55° with respect to a second direction V2, which is parallel to a first tangent 41 at the edge of the wafer 10 in the first direction V1.

The method for manufacturing the semiconductor element according to the first embodiment will next be described in detail.

Process of Providing Wafer 10

First, the wafer 10 is provided as shown in step S1 of FIG. 1.

Figure 2A:
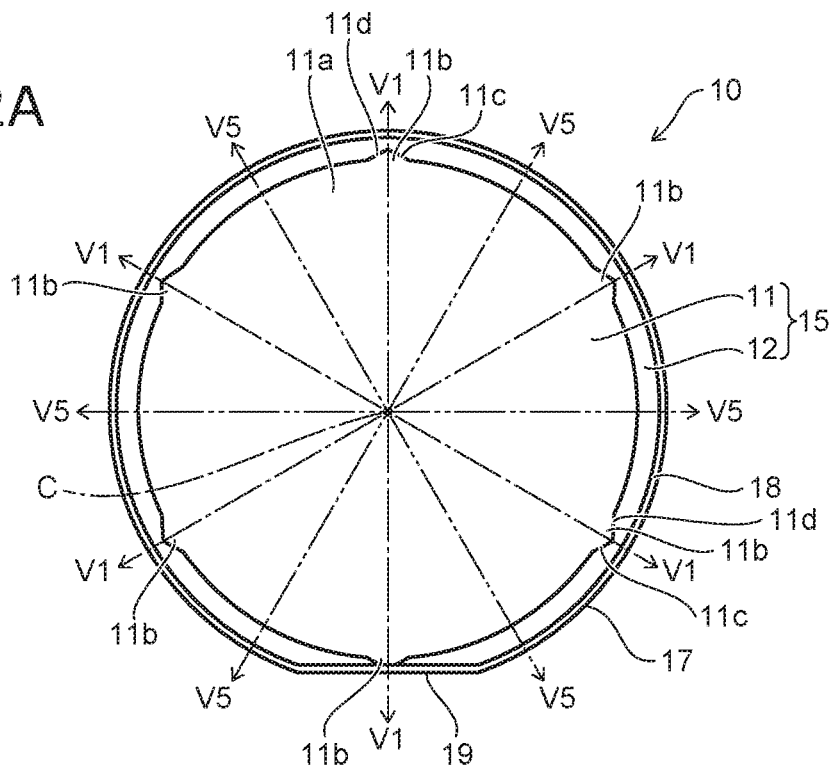
FIG. 2A is a plan view showing a wafer of the first embodiment.
Figure 2B:
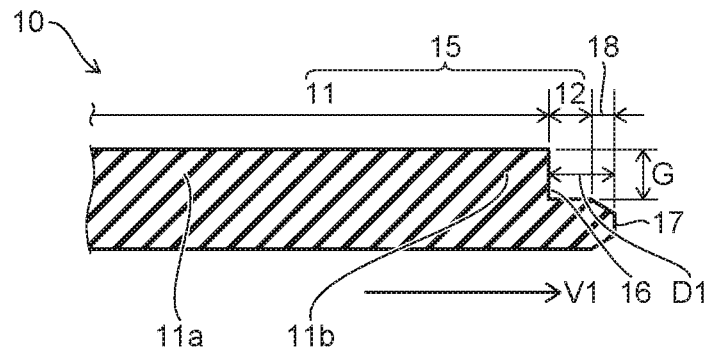
FIG. 2B is a partial end view along a first direction shown in FIG. 2A.
Figure 2C:
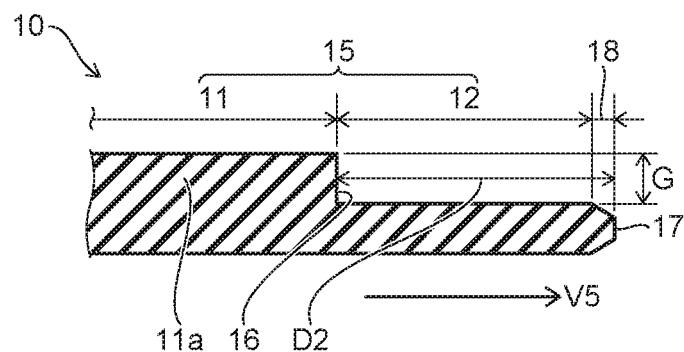
FIG. 2C is a partial end view along a fifth direction shown in FIG. 2A.

The wafer 10 is, for example, a sapphire substrate, and is made of, for example, single-crystal sapphire. As shown in FIG. 2A, the wafer 10 has a substantially disk-shaped configuration with a diameter not less than about 70 mm and not more than about 300 mm. The thickness of the wafer 10 is, for example, not less than 100 μm and not more than 800 μm, and preferably not less than 100 μm and not more than 300 μm. The thickness of the wafer 10 may be thinned as necessary by polishing, grinding, etc. An orientation flat 19 that is chord-shaped in top-view may be provided in the wafer 10. A bevel portion 18 is provided at the outer perimeter portion of the wafer 10. As shown in FIGS. 2B and 2C, the thickness of the bevel portion 18 decreases toward the edge 17 of the wafer 10. Unlike the first region 11 and the second region 12, the bevel portion 18 includes a crystal surface of the wafer 10 at which the semiconductor layer 20 is not formed. The edge of the bevel portion 18 is a portion corresponding to the edge 17 of the wafer 10.

The upper surface 15 of the wafer 10 is taken to be a portion other than the bevel portion 18. The upper surface 15 is, for example, the c-plane of the sapphire of the wafer 10. For example, the angle between the upper surface 15 and the c-plane of the sapphire is 5° or less. The upper surface 15 may be tilted with respect to the c-plane of the sapphire.

A case will next be described where a sapphire substrate is used as the wafer 10, and the semiconductor layer 20 that is made of a nitride semiconductor is formed at the upper surface 15 of the wafer 10, which is the c-plane of the sapphire substrate. The first direction V1 and a fifth direction V5 are set in the upper surface 15 of the wafer 10. Both of the first and fifth directions V1 and V5 are parallel to the upper surface 15, and six directions of the first direction V1 and six directions of the fifth direction V5 are set in the first embodiment. As described below, when the semiconductor layer 20 is formed on the upper surface 15 of the wafer 10, the first direction V1 passes through the center C of the wafer 10 parallel to an m-axis of the semiconductor layer 20. Also, when the semiconductor layer 20 is formed on the upper surface 15 of the wafer 10, the fifth direction V5 passes through the center C parallel to an a-axis of the semiconductor layer 20. The center C of the wafer 10 is the center of the circumcircle of the wafer 10 In top-view. For example, the angle between the first directions V1 is 60°. For example, the angle between the fifth directions V5 is 60°. For example, the angle between adjacent first and fifth directions V1 and V5 is 30°.

The upper surface 15 of the wafer 10 includes the first region 11 and the second region 12. The first region 11 is surrounded with the second region 12 in a top-view. The second region 12 is provided at the periphery of the first region 11 in a top-view and is at a lower position than the first region 11. Therefore, a step 16 is formed between the first region 11 and the second region 12. A height G of the step 16 can be modified as appropriate to match the total film thickness of the semiconductor layer 20 formed at the upper surface 15 of the wafer 10. The height of the step 16 is the distance between the first region 11 and the second region 12 in the thickness direction of the wafer 10. For example, the second region 12 is at a position not less than 2 μm lower than the first region 11. In other words, the height G of the step 16 is, for example, 2 μm or more. Also, the height G of the step 16 is, for example, 30 μm or less. The height G of the step 16 is, for example, not less than 4 μm and not more than 8 μm.

By setting the height G of the step 16 to be 2 μm or more, the effect of suppressing the propagation to the central portion of the wafer 10 of cracks that occur in the second region 12 of the wafer 10 as described below is easily obtained. By setting the height G of the step 16 to be 30 μm or less, the time necessary to process the wafer 10 can be shortened. The surface of the step 16 is perpendicular to the upper surface 15 of the wafer 10 in FIGS. 2B and 2C, but may be tilted with respect to the upper surface 15 of the wafer 10.

The first region 11 includes a circular portion 11a, and the extension portion 11b extending from the circular portion 11a toward the edge of the wafer 10. In a top-view, the first region 11 has a configuration in which the extension portions 11b at six locations along the first directions V1 extend toward the edge 17 of the wafer 10 from the outer edge of one circular portion 11a. For example, the center of the circular portion 11a matches the center C of the wafer 10. The extension length of each extension portion 11b is, for example, not less than 0.1 mm and not more than 10 mm, and preferably not less than 0.5 mm and not more than 5 mm. Setting the extension length of the extension portion 11b to be 0.1 mm or more can effectively reduce the region where the film thickness of the semiconductor layer 20 formed at the end portion periphery of the first region 11 in the first direction V1 is thicker than the semiconductor layer 20 in the other regions. By setting the extension length of the extension portion 11b to be 10 mm or less, the surface area of the second region 12 provided in the first direction V1 is ensured, and the extension of the cracks from the second region 12 toward the first region 11 is easily suppressed.

Therefore, a first distance D1 between the first region 11 and the edge 17 of the wafer 10 in the first direction V1 is less than a second distance D2 between the first region 11 and the edge 17 of the wafer 10 in the fifth direction V5 by the amount of the extension length of the extension portion 11b. In other words, the relationship between the first distance D1 and the second distance D2 is first distance D1<second distance D2. The first distance D1 is, for example, not less than 0.1 mm and not more than 5 mm, and preferably not less than 0.2 mm and not more than 3 mm. The second distance D2 is, for example, not less than 1 mm and not more than 10 mm.

It is favorable for the second distance D2 between the first region 11 and the edge 17 of the wafer 10 in the fifth direction V5, which is parallel to the a-axis of the semiconductor layer 20, to be not more than 1/10 of the diameter of the wafer 10. By setting such a second distance D2, the propagation to the central portion of the wafer 10 of the cracks occurring in the semiconductor layer 20 at the second region 12 can be suppressed efficiently while ensuring the surface area of the first region 11. For example, the second distance D2 is 10 mm or less when the diameter of the wafer 10 is 100 mm. The second distance D2 is 15 mm or less when the diameter of the wafer 10 is 150 mm. The second distance D2 is 20 mm or less when the diameter of the wafer 10 is 200 mm. The second distance D2 is 30 mm or less when the diameter of the wafer 10 is 300 mm.

In the first embodiment, the second region 12 is provided between the circular portion 11a and the bevel portion 18 in a top-view. Conversely, there may be a portion between the extension portion 11b and the bevel portion 18 in which the second region 12 is not provided. In the example shown in FIGS. 2A and 2B, the extension portion 11b does not reach the bevel portion 18, and the second region 12 is provided between the extension portion 11b and the bevel portion 18.

Figure 3:
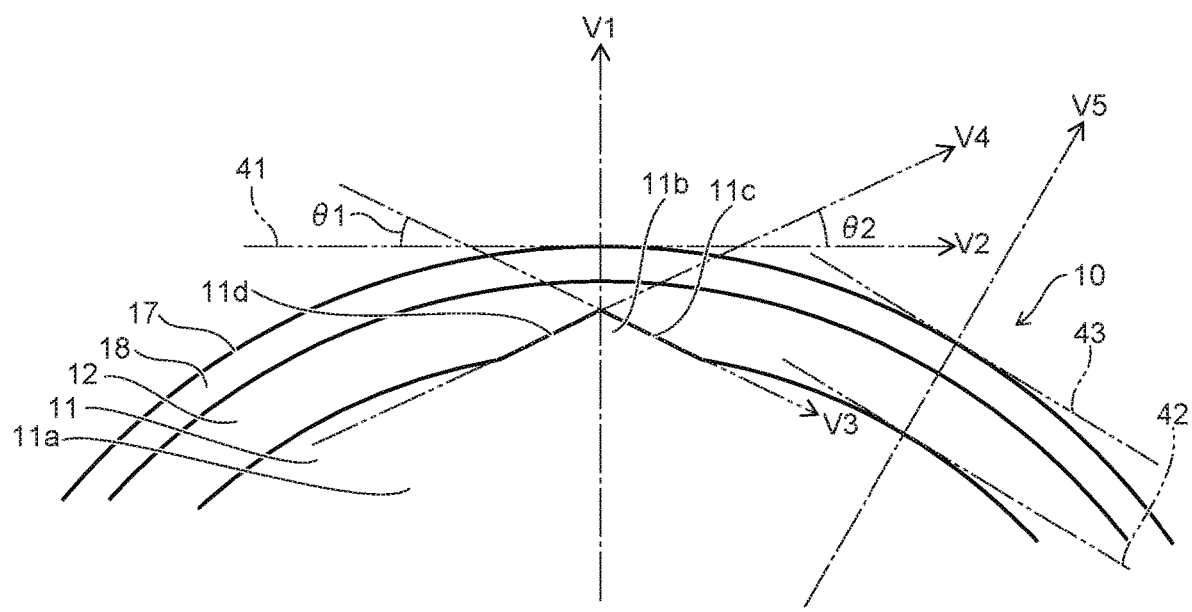
FIG. 3 is a partially enlarged plan view showing the wafer of the first embodiment.

As shown in FIG. 3, the extension portion 11b includes the first side surface 11c and a second side surface 11d. The first side surface 11c is parallel to the third direction V3. The third direction V3 is tilted at the angle θ1 with respect to the second direction V2. The second direction V2 is parallel to the first tangent 41 at the edge 17 of the wafer 10 in the first direction V1. The angle θ1 is not less than 5° and not more than 55°, preferably not less than 5° and not more than 30°, and more preferably not less than 5° and not more than 20°. Setting the angle θ1 to be not less than 5° and not more than 55° can reduce the size of the region in which the semiconductor layer 20 formed at the end portion periphery of the first region 11 in the first direction V1 is thicker than the semiconductor layer 20 in the other regions.

The second side surface 11d is parallel to a fourth direction V4. The fourth direction V4 is different from the third direction V3 and is tilted at an angle θ2 with respect to the second direction V2. The angle θ2 is not less than 5° and not more than 55°, preferably not less than 5° and not more than 30°, and more preferably not less than 5° and not more than 20°. By setting the angle θ2 to be not less than 5° and not more than 55°, effects similar to those of the first side surface 11c described above can be obtained. The first side surface 11c and the second side surface 11d are continuous. That is, a portion of the first side surface 11c and a portion of the second side surface 11d contact each other. The effect of suppressing a thicker end portion periphery of the first region 11 in the first direction V1 due to the first and second side surfaces 11c and 11d described above can be efficiently obtained thereby.

In a top-view as shown in FIGS. 2A and 3, a second tangent 42 at the edge of the first region 11 in the fifth direction V5, which passes through the center C of the wafer 10 parallel to the a-axis of the semiconductor layer 20, is parallel to a third tangent 43 at the edge 17 of the wafer 10 in the fifth direction V5. The extension portion 11b that is provided at the end portion of the first region 11 in the first direction V1 is not provided at the end portion of the first region 11 in the fifth direction V5. In other words, the extension portion 11b is provided only at the end portion of the first region 11 in the first direction V1. Thereby, the surface area of the second region 12 in the first direction V1 is ensured, and the effect of suppressing the propagation to the central portion of the wafer 10 of the cracks occurring in the semiconductor layer 20 at the second region 12 can be obtained.

Process of Forming Semiconductor Layer 20

Then, as shown in step S2 of FIG. 1, the semiconductor layer 20 that is made of a nitride semiconductor is formed on the wafer 10.

Figure 4A:
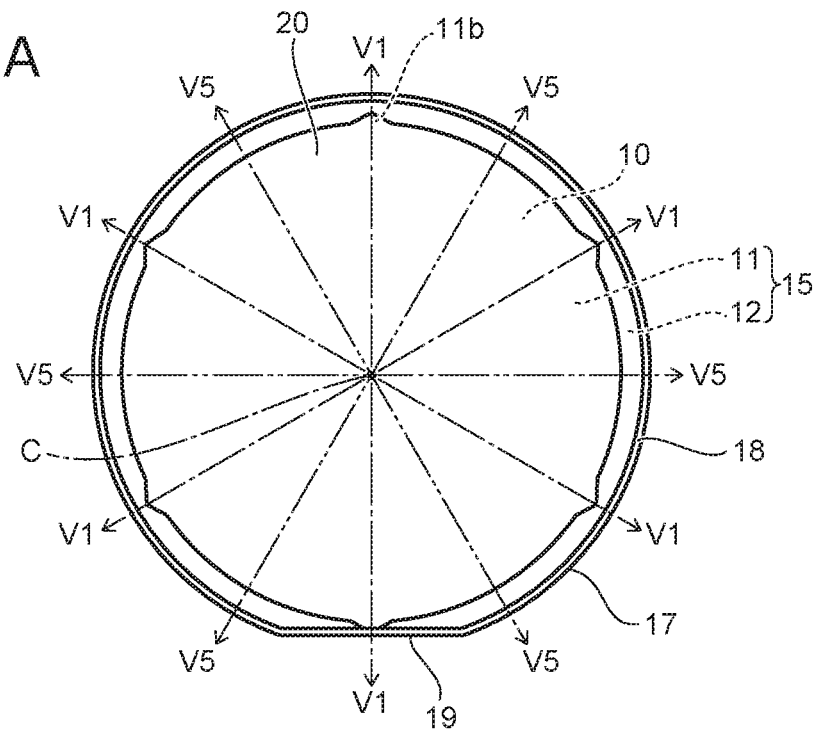
FIG. 4A is a plan view showing the wafer and a semiconductor layer of the first embodiment.
Figure 4B:
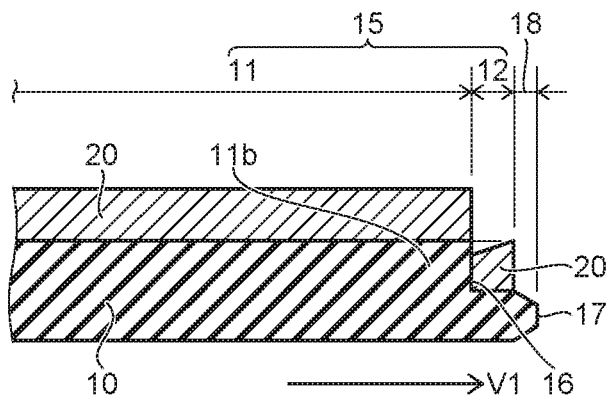
FIG. 4B is a partial end view along the first direction shown in FIG. 4A.
Figure 4C:
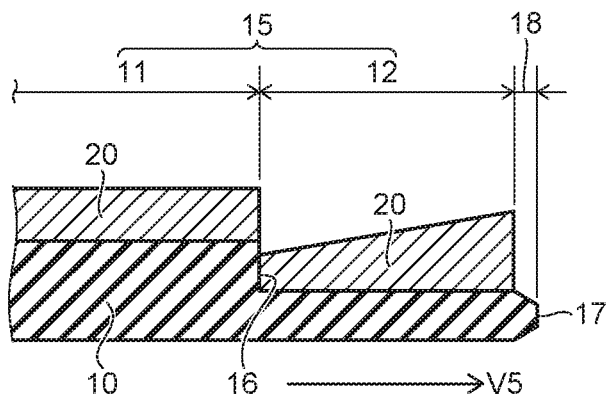
FIG. 4C is a partial end view along the fifth direction shown in FIG. 4A.
Figure 5A:
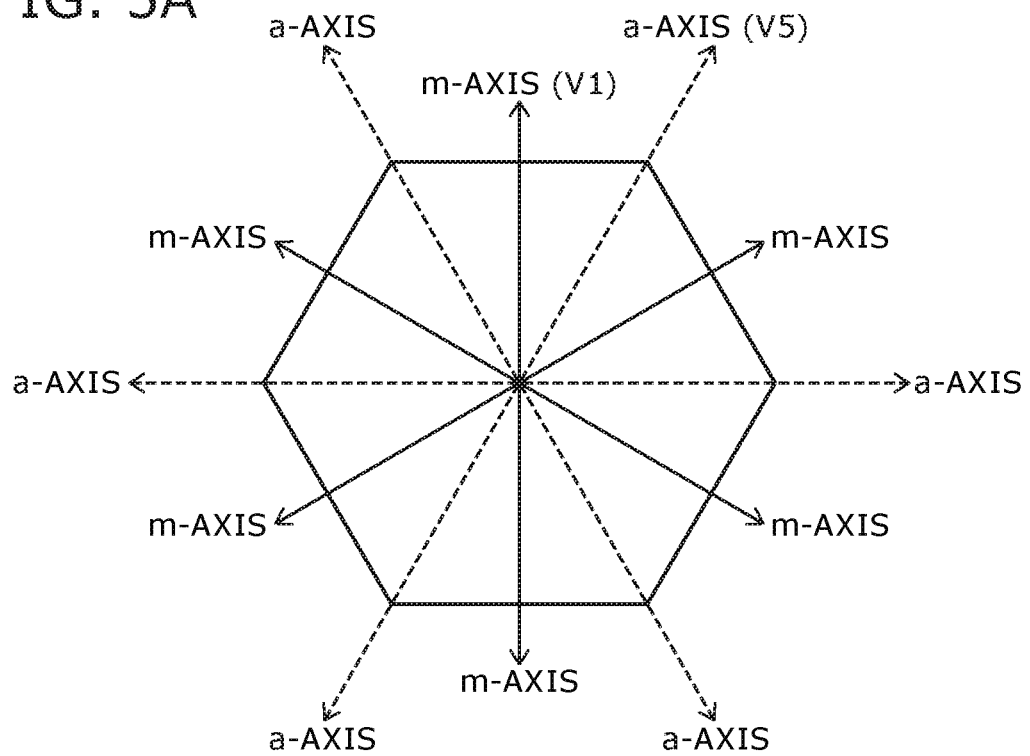
FIG. 5A is a plan view showing crystal orientations of the semiconductor layer.
Figure 5B:
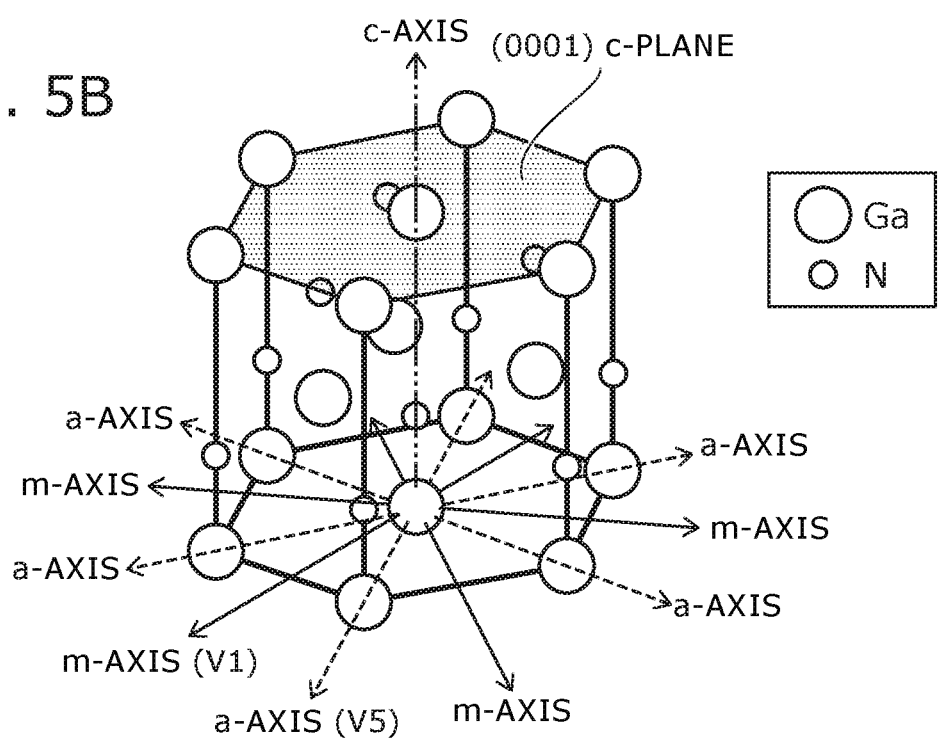
FIG. 5B is a perspective view showing the crystal orientations of the semiconductor layer.

As shown in FIGS. 4A to 4C, the semiconductor layer 20 is epitaxially grown on the upper surface 15 of the wafer 10 by, for example, using the wafer 10 as a substrate for crystal growth and by performing vapor deposition such as MOCVD (Metal Organic Chemical Vapor Deposition), etc. The semiconductor layer 20 is formed at both the first region 11 and the second region 12. As shown in FIGS. 5A and 5B, the (0001) c-plane of the semiconductor layer 20 is parallel to the upper surface 15 of the wafer 10. The first direction V1 is parallel to the m-axis of the semiconductor layer 20, and the fifth direction V5 is parallel to the a-axis of the semiconductor layer 20. The first direction V1 is a direction from the center C of the wafer 10 toward the edge 17 of the wafer 10 and exists in six directions as shown in FIG. 2A. The fifth direction V5 is a direction from the center C of the wafer 10 toward the edge 17 of the wafer 10 and exists in six directions as shown in FIG. 2A. The semiconductor layer 20 includes, for example, a Group III-V nitride semiconductor ($In_XAl_YGa_{1-X-Y}N$ (0≤X, 0≤Y, and X+Y≤1)). The semiconductor layer 20 includes, for example, an n-type semiconductor layer, a p-type semiconductor layer, and a light-emitting layer positioned between the n-type semiconductor layer and the p-type semiconductor layer.

The light emission peak wavelength of the light from the light-emitting layer is, for example, not less than 330 nm and not more than 400 nm. When the peak wavelength of the light emitted from the light-emitting layer is not less than 330 nm and not more than 400 nm, the light from the light-emitting layer is easily absorbed by the semiconductor layer if the semiconductor layer 20 is a semiconductor layer that does not include aluminum (Al), e.g., is made of gallium nitride (GaN). For example, by including an AlGaN layer including aluminum in the semiconductor layer 20, the light from the light-emitting layer is not easily absorbed by the semiconductor layer. For example, compared to the case in which much of the semiconductor layer 20 is made of GaN, the semiconductor layer 20 does not easily absorb the light emitted from the light-emitting layer if the AlGaN layer in the semiconductor layer 20 is, for example, 20% or more of the total film thickness of the semiconductor layer 20. For example, it is favorable for the semiconductor layer 20 to include $Al_{x1}Ga_{1-x1}N$ (0.03≤x1≤0.08).

Another example of the light emission peak wavelength from the light-emitting layer is, for example, not less than 250 nm and not more than 330 nm. When the peak wavelength of the light emitted from the light-emitting layer is not less than 250 nm and not more than 330 nm as well, the light from the light-emitting layer is easily absorbed by the semiconductor layer if the semiconductor layer 20 is a semiconductor layer that does not include aluminum (Al), e.g., is made of gallium nitride (GaN). By including an AlGaN layer including aluminum in the semiconductor layer 20, the light from the light-emitting layer is not easily absorbed by the semiconductor layer. For example, compared to the case in which much of the semiconductor layer 20 is made of GaN, the semiconductor layer 20 does not easily absorb the light emitted from the light-emitting layer if the AlGaN layer in the semiconductor layer 20 is, for example, 20% or more of the total film thickness of the semiconductor layer 20. For example, it is favorable for the semiconductor layer 20 to include $Al_{x1}Ga_{1-x1}N$ ($0.5 \leq x1 \leq 1$).

In the first embodiment, the extension portion 11b that includes the first side surface 11c and the second side surface 11d is provided at the end portion of the semiconductor layer 20 positioned in the first direction V1 when viewed from the center C of the wafer 10. The third direction V3 that is parallel to the first side surface 11c and the fourth direction V4 that is parallel to the second side surface 11d are tilted with respect to the second direction V2. Thereby, compared to a form in which the extension portion 11b is not provided, the semiconductor layer 20 on the first region 11 is suppressed from being partially thicker. It is estimated that the partially-thick semiconductor layer 20 is suppressed because the growth of the semiconductor layer at the end portion periphery of the semiconductor layer 20 positioned in the first direction V1 is similar to the growth at the end portion of the semiconductor layer 20 positioned in the fifth direction V5 because the first side surface 11c and the second side surface 11d are provided. As a result, the upper surface 15 of the semiconductor layer 20 in the first region 11 can be flatter, and the film thickness of the semiconductor layer 20 can be made uniform. By making the film thickness of the semiconductor layer 20 uniform in the first region 11, it is favorable for the difference between the maximum film thickness and the minimum film thickness of the semiconductor layer 20 to be about 2 μm or less.

For example, semiconductor elements are made from the wafer 10 and the semiconductor layer 20 by the following processes. For example, a support wafer is bonded to the wafer 10 with the semiconductor layer 20 interposed. The support wafer is, for example, a silicon wafer. At this time, the support wafer can be bonded with a bonding member or the like with higher precision because the film thickness of the semiconductor layer 20 formed on the first region 11 is substantially uniform.

Thereafter, the support wafer is used as a support substrate, and a structure body that includes the wafer 10, the semiconductor layer 20, and the support wafer is processed. For example, the wafer 10, which is a substrate for crystal growth, may be detached from the semiconductor layer 20. Thus, the semiconductor element is manufactured. The semiconductor element is, for example, a light-emitting element such as a light-emitting diode (LED), a laser diode (LD), etc.

Effects of the method for manufacturing the semiconductor element according to the first embodiment will next be described.

In the method for manufacturing the semiconductor element according to the first embodiment, the first region 11 and the second region 12 are provided in the upper surface 15 of the wafer 10. Thereby, the semiconductor layer 20 is formed on the first region 11 and the second region 12 when the semiconductor layer 20 is formed on the upper surface 15. Because the step 16 is formed between the first region 11 and the second region 12, the propagation of the cracks that occur in the semiconductor layer 20 formed on the second region 12 is impeded by the step 16, and the cracks do not easily penetrate the semiconductor layer 20 formed at the first region 11. Thereby, the occurrence of the cracks in the semiconductor layer 20 can be reduced, and the semiconductor element can be manufactured with a high yield.

According to the first embodiment, the extension portion 11b that includes the first side surface 11c and the second side surface 11d is provided at the end portion of the semiconductor layer 20 positioned in the first direction V1 when viewed from the center C. Thereby, a locally thicker semiconductor layer 20 can be suppressed, and the film thickness of the semiconductor layer 20 can be more uniform. As a result, the precision of the processing in the subsequent processes is increased. For example, the support wafer can be bonded with high precision to the wafer 10 with the semiconductor layer 20 interposed.

Accordingly, according to the method for manufacturing the semiconductor element according to the first embodiment, the yield of the semiconductor element can be increased.

Modification of First Embodiment

A modification of the embodiment will next be described.

Compared to the first embodiment, the configuration of the wafer of the modification is different. Other than configuration of the wafer, the modification is similar to the first embodiment.

Figure 6:
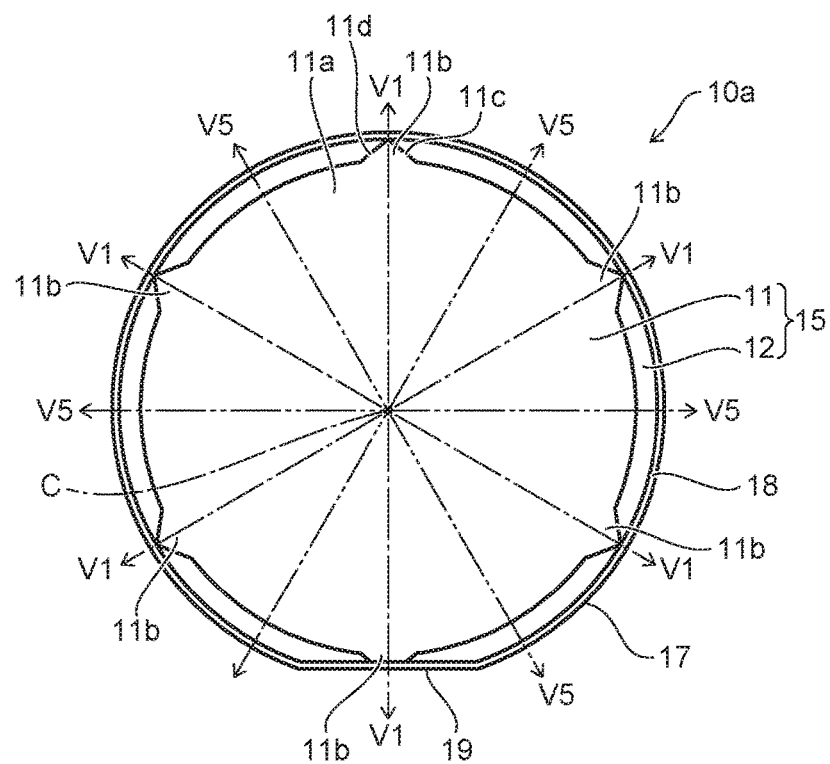
FIG. 6 is a plan view showing a wafer of a modification of the first embodiment.
Figure 7:
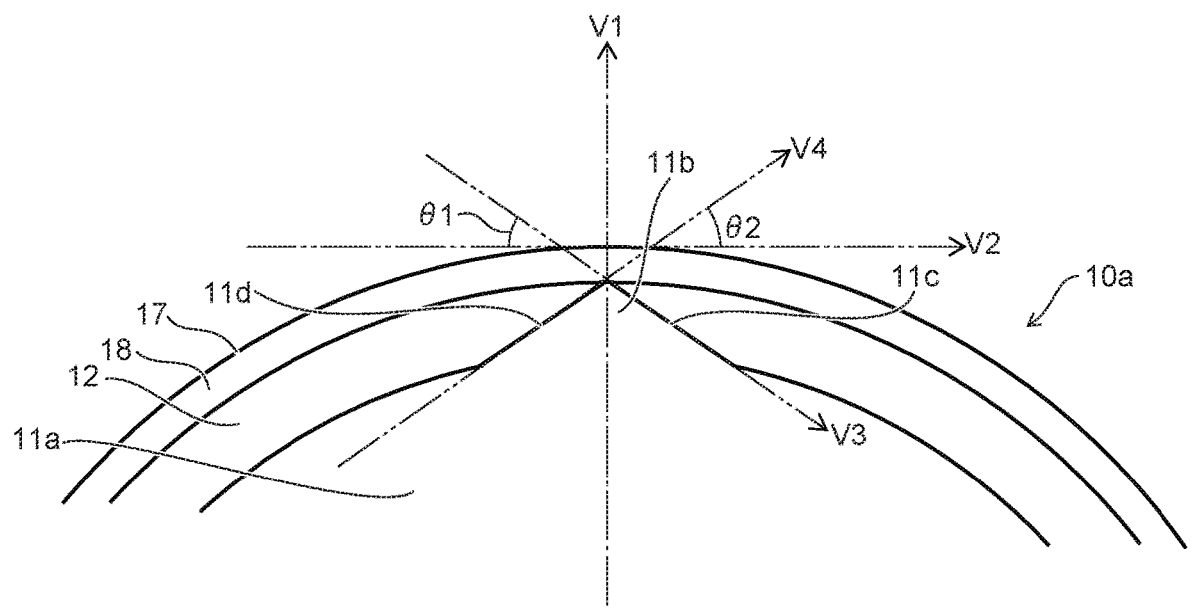
FIG. 7 is a partially enlarged plan view showing the wafer of the modification of the first embodiment.

In a wafer 10a of the modification as shown in FIGS. 6 and 7, the extension portion 11b of the first region 11 reaches the edge of the upper surface 15 of the wafer 10a. In other words, the extension portion 11b reaches the bevel portion 18, and the second region 12 is not provided between the extension portion 11b and the bevel portion 18. Although effects similar to those of the first embodiment are obtained by the modification as well, some of the effects are different from those of the first embodiment. For example, compared to the first embodiment described above, the effect of suppressing the extension of the cracks by the second region 12 in the first direction V1 is not easily obtained in the modification. On the other hand, the partially thicker semiconductor layer 20 is easily suppressed because the surface area of the first region 11 can be increased.

Second Embodiment

A method for manufacturing a semiconductor element according to a second embodiment of the present disclosure will next be described.

The method for manufacturing the semiconductor element according to the second embodiment includes a process of providing a wafer 50 (step S1) and a process of forming the semiconductor layer 20, which is made of a nitride semiconductor, on the wafer 50 (step S2).

An upper surface 55 of the wafer 50 includes the first region 11, and the second region 12 that is provided at the periphery of the first region 11 at a lower position than the first region 11. In a top view of the wafer 50, the second region 12 includes an extension portion 12b at an end portion of the second region 12 in the first direction V1, which passes through the center C of the wafer 50 parallel to the m-axis of the semiconductor layer 20; and the extension portion 12b extends in a direction from the edge 17 of the wafer 50 toward the center C of the wafer 50. The extension portion 12b includes a first side surface 12c parallel to the third direction V3, which is tilted at the angle θ1 that is not less than 5° and not more than 55° with respect to the second direction V2, which is parallel to the first tangent 41 at the edge 17 of the wafer 50 in the first direction V1.

The method for manufacturing the semiconductor element according to the second embodiment will next be described in detail.

Compared to the first embodiment, the configuration of the wafer of the second embodiment is different. Other than the wafer, the configuration and the effects of the second embodiment are similar to those of the first embodiment.

Figure 8:
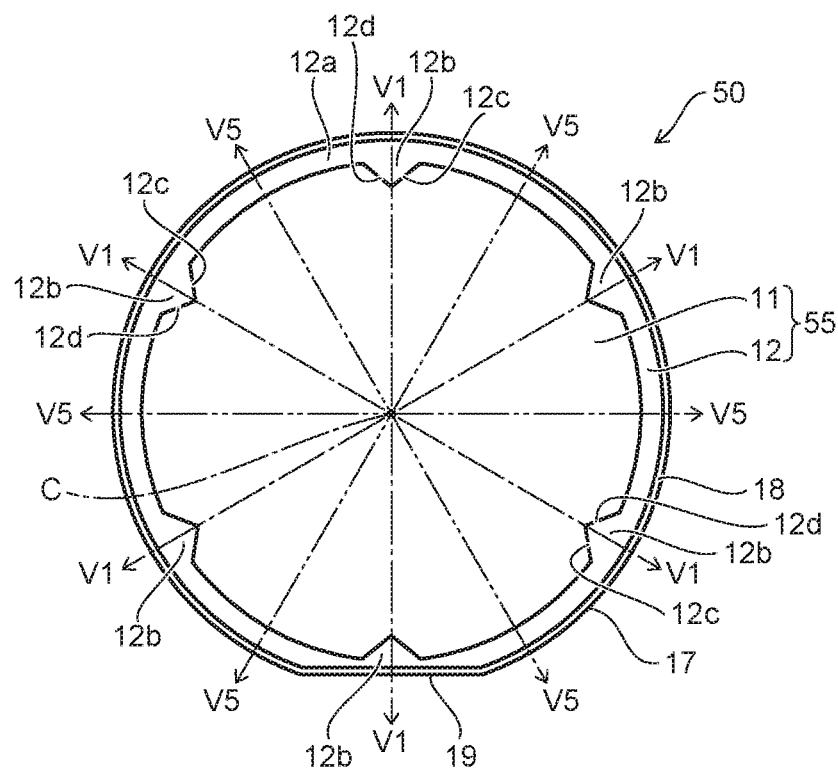
FIG. 8 is a plan view showing a wafer of a second embodiment.
Figure 9:
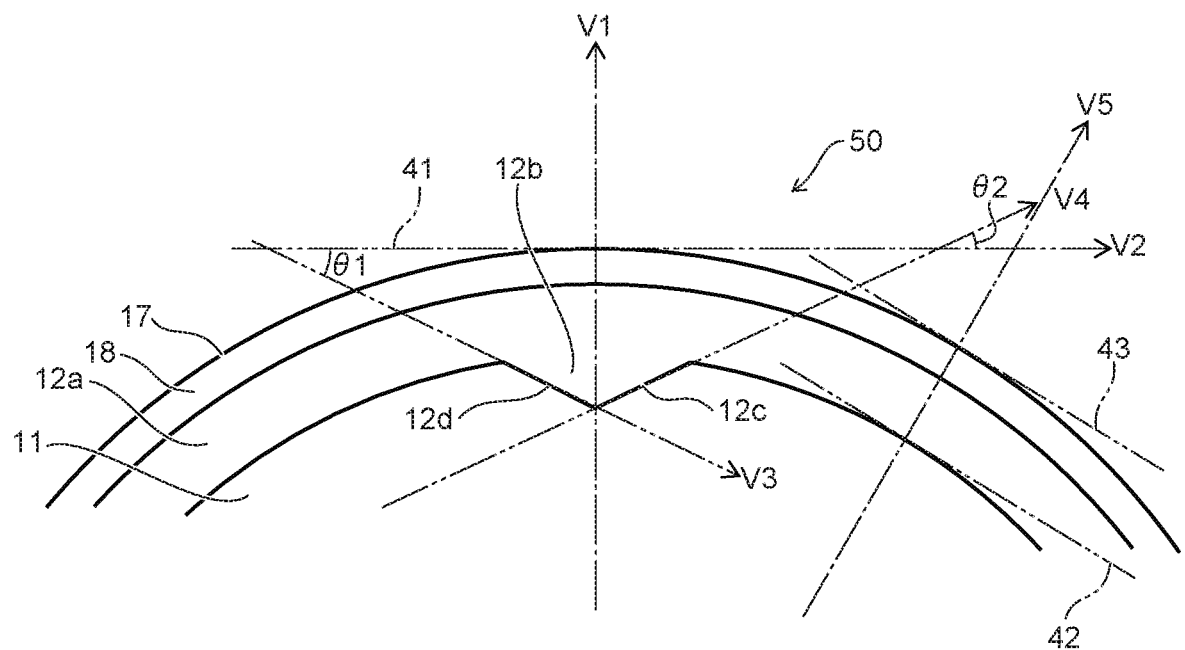
FIG. 9 is a partially enlarged plan view showing the wafer of the second embodiment.

As shown in FIGS. 8 and 9, the upper surface 55 of the wafer 50 includes the first region 11, and the second region 12 that is provided at the periphery of the first region 11 at a lower position than the first region 11. The second region 12 includes a ring-like portion 12a and the extension portion 12b.

In a top view of the wafer 50, the ring-like portion 12a has a substantially circular-ring shape and is continuous with the bevel portion 18. The end portion of the ring-like portion 12a contacts the bevel portion 18. The extension portion 12b is provided at an end portion in the first direction V1, which passes through the center C of the wafer 50 parallel to the m-axis of the semiconductor layer 20. The extension portion 12b extends inward in the wafer 50 from the ring-like portion 12a. In other words, the extension portion 12b extends in a direction from the edge 17 of the wafer 50 toward the center C of the wafer 50. As described in the first embodiment, the first direction V1 corresponds to the m-axis of the semiconductor layer 20 and exists in a total of six directions. Accordingly, the extension portion 12b is provided at six locations corresponding to the first directions V1.

As shown in FIG. 9, the extension portion 12b includes the first side surface 12c and a second side surface 12d. The first side surface 12c is parallel to the third direction V3, and the second side surface 12d is parallel to the fourth direction V4. The definitions of the third and fourth directions V3 and V4 are similar to those of the first embodiment. In other words, the third direction V3 is tilted at the angle θ1 that is not less than 5° and not more than 55° with respect to the second direction V2. The fourth direction V4 is different from the third direction V3 and is tilted at the angle θ2 that is not less than 5° and not more than 55° with respect to the second direction V2. The first side surface 12c and the second side surface 12d are continuous. That is, a portion of the first side surface 12c and a portion of the second side surface 12d contact each other. Thereby, a thicker film at the end portion periphery of the first region 11 in the first direction V1 can be efficiently suppressed by the first and second side surfaces 12c and 12d described above.

In a top-view, a second tangent 42 at the edge of the first region 11 in the fifth direction V5, which passes through the center C of the wafer 50 parallel to the a-axis of the semiconductor layer, is parallel to the third tangent 43 at the edge 17 of the wafer 50 in the fifth direction V5. Otherwise, the configuration of the wafer 50 is similar to the configuration of the wafer 10.

According to the second embodiment, effects similar to those of the first embodiment can be obtained.

COMPARATIVE EXAMPLE

A comparative example will next be described.

Figure 10:
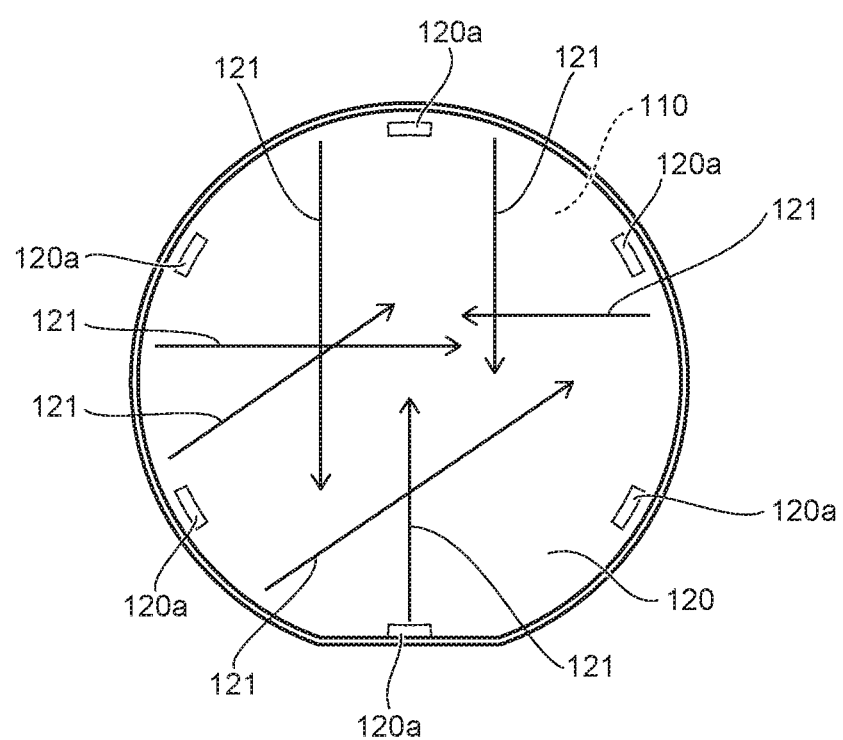
FIG. 10 is a plan view showing a method for manufacturing a semiconductor element according to a comparative example.

FIG. 10 is a plan view showing a method for manufacturing a semiconductor element according to the comparative example.

In the comparative example as shown in FIG. 10, regions that have different heights are not provided in the upper surface of a wafer 110. Therefore, the entire upper surface of the wafer 110 is flat. Then, a semiconductor layer 120 is formed on the upper surface of the wafer 110. In such a case, the film thickness of the outer perimeter portion of the semiconductor layer 120 is relatively thick. In particular, a thick film portion 120a that is formed at the end portion of the semiconductor layer 120 positioned in the first direction V1 when viewed from the center C is thicker than the end portion in the other directions.

Compared to the case in which the semiconductor layer 120 does not include aluminum, the tendency of the film thickness at the outer perimeter portion of the semiconductor layer 120 to be thicker than the other regions is pronounced when the semiconductor layer 120 includes aluminum (Al). It is considered that this due to unintended growth occurring easily in the semiconductor layer 120 at the outer perimeter portion of the semiconductor layer 120 when the semiconductor layer 120 includes aluminum. Also, the film thickness of the outer perimeter portion of the semiconductor layer 120 is dependent on the direction from the center C, and the film thickness of the end portion positioned in the first direction V1 when viewed from the center C is greater than the film thickness of the end portion positioned in the fifth direction V5 when viewed from the center C. The portion of the semiconductor layer 120 that is formed on the first region 11 and positioned at the end portion in the first direction V1 when viewed from the center C is taken as the thick film portion 120a. The thick film portion 120a exists at six locations of the semiconductor layer 120 at the end portions in the first directions V1 when viewed from the center C.

The reason that the film thickness becomes nonuniform is not exactly clear, but is inferred to be, for example, as follows. As described above, the first direction V1 is along the m-axis of the semiconductor layer 120, and the fifth direction V5 is along the a-axis of the semiconductor layer 120. The (0001) c-plane of the semiconductor layer 120 is parallel to the upper surface of the wafer 110. In such a case, with respect to the (0001) c-plane of the semiconductor layer 120, the growth rate of the semiconductor layer 120 along the m-axis (the first direction V1) of the semiconductor layer 120 is slower than the growth rate of the semiconductor layer 120 along the a-axis (the fifth direction V5) of the semiconductor layer 120. Therefore, it is inferred that the film thickness at the end portion in the first direction V1, which has a slow growth rate with respect to the (0001) c-plane of the semiconductor layer 120, becomes thicker than the periphery because the growth rate of the fifth direction V5, which is faster than the growth rate of the first direction V1, enhances the growth rate of the first direction V1 in the semiconductor layer 120.

Therefore, there are cases in which unintended growth of the semiconductor layer occurs at the end portion of the semiconductor layer 120, and cracks 121 occur from such portions. Here, unintended growth of the semiconductor layer means that a semiconductor layer having a different composition, crystallinity, etc., from the semiconductor layer grown on the wafer 10 is formed. In the comparative example, the upper surface of the wafer 110 is flat, and a step is not formed in the upper surface of the wafer 110. Therefore, the cracks 121 that occur at the end portion of the semiconductor layer 120 easily propagate to the central portion of the semiconductor layer 120. As a result, the yield of the semiconductor layer 120 decreases. The cracks 121 at the end portion of the semiconductor layer 120 easily occur when the semiconductor layer 120 includes a semiconductor layer including aluminum. As described above, it is inferred that this is because unintended growth of the semiconductor layer easily occurs at the end portion of the semiconductor layer 120 when the semiconductor layer 120 includes a semiconductor layer including aluminum, and the cracks 121 easily occur at such portions.

Reference Example

A reference example will next be described.

Figure 11A:
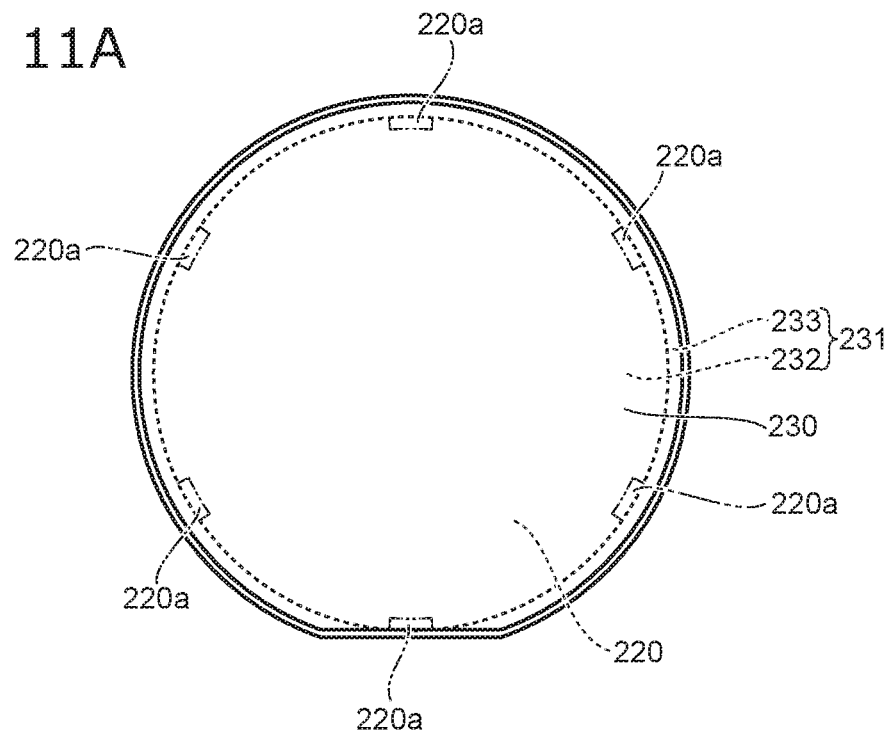
FIG. 11A is a plan view showing a method for manufacturing a semiconductor element according to a reference example.
Figure 11B:
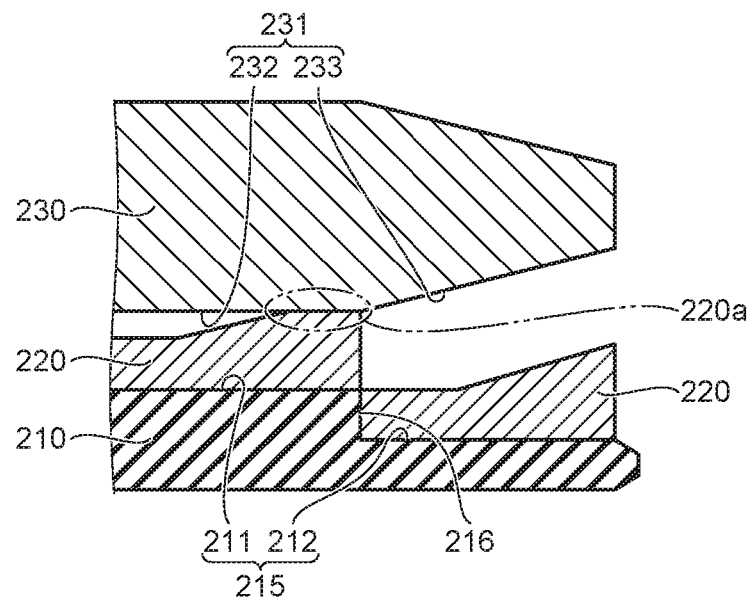
FIG. 11B is a partial end view showing the method for manufacturing the semiconductor element according to the reference example.

In the reference example as shown in FIGS. 11A and 11B, a first region 211 and a second region 212 are provided in an upper surface 215 of a wafer 210. However, an extension portion is not provided in the first region 211 or the second region 212, and the outer edge of the first region 211 is circular in a top view. Therefore, a thick film portion 220a of a semiconductor layer 220 is formed at a position in the first direction V1 when viewed from the center C at an outer perimeter portion of the portion of the semiconductor layer 220 provided in the first region 211.

In the reference example, the second region 212 is provided in the upper surface 215 of the wafer 210; therefore, the propagation of cracks is impeded by a step 216 between the first region 211 and the second region 212 even when the cracks occur at the end portion of the semiconductor layer 220. Therefore, the cracks that occur at the end portion of the semiconductor layer 220 do not easily propagate to the central portion of the semiconductor layer 220.

However, in the reference example, there is a possibility that discrepancies may occur when bonding a support wafer 230 to the wafer 210 with the semiconductor layer 220 interposed. The exterior form of the wafer 210 is substantially the same as the exterior form of the support wafer 230. In such a case, the thick film portion 220a abuts a flat portion 232 of a lower surface 231 of the support wafer 230 because the extension portion is not provided in the first region 211. Because the thick film portion 220a of the semiconductor layer 220 contacts the flat portion 232 of the support wafer 230, bonding defects occur and the yield decreases because the portion of the semiconductor layer 220 other than the thick film portion 220a no longer adequately abuts the support wafer 230.

Even when the support wafer 230 is not used, high-precision processing in the subsequent processes is difficult because the thick film portion 220a is formed in the semiconductor layer 220. Therefore, the yield of the semiconductor element may be reduced.

Test Example

A test example will next be described.

Figure 12A:
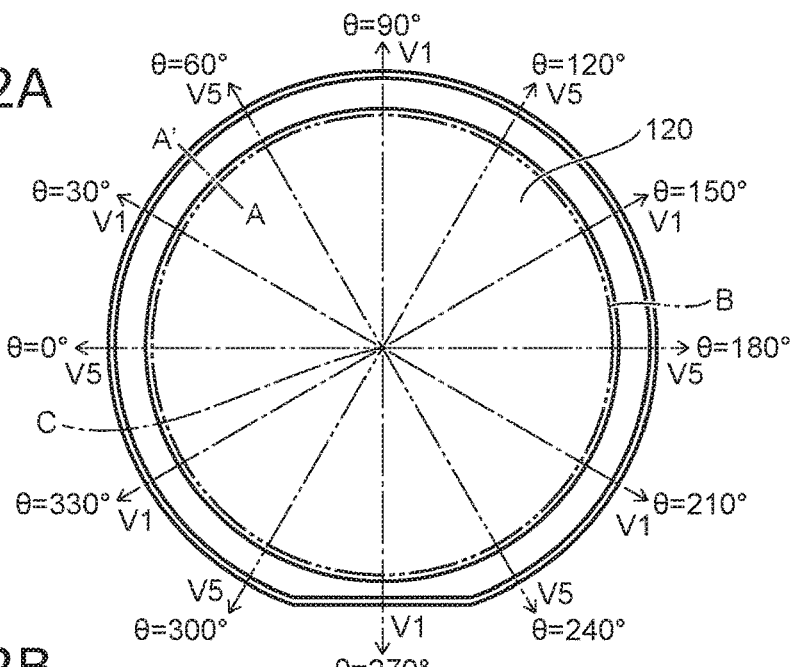
FIG. 12A is a plan view showing a wafer and a semiconductor layer of a test example.

FIG. 12A is a plan view showing the wafer 110 and the semiconductor layer 120 of the test example.

Figure 12B:
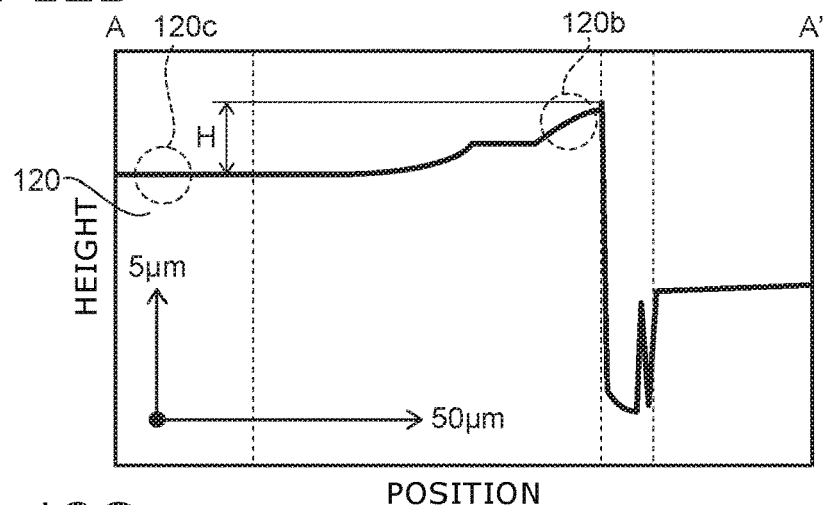
FIG. 12B is a graph showing the shape of the semiconductor layer along line segment A-A' shown in FIG. 12A, in which the horizontal axis is the position in the radial direction, and the vertical axis is the height of the upper surface of the semiconductor layer.

FIG. 12B is a graph showing the configuration of the semiconductor layer 120 along line segment A-A' shown in FIG. 12A, in which the horizontal axis is the position in the radial direction, and the vertical axis is the height of the upper surface of the semiconductor layer 120.

Figure 12C:
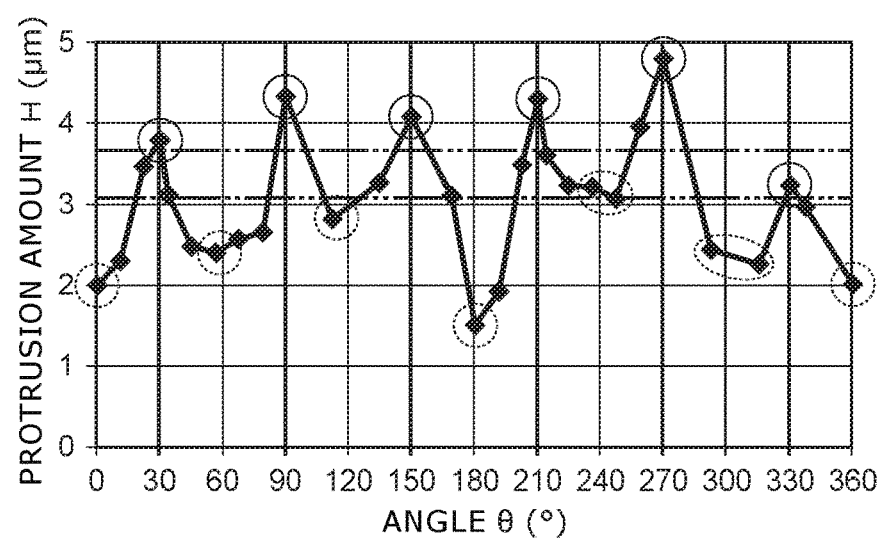
FIG. 12C is a graph showing the shape of the semiconductor layer along circle B shown in FIG. 12A, in which the horizontal axis is an angle θ, and the vertical axis is a protrusion amount H.

FIG. 12C is a graph showing the configuration of the semiconductor layer 120 along circle B shown in FIG. 12A, in which the horizontal axis is the angle θ, and the vertical axis is the protrusion amount H.

The angle θ is an angle when viewed from the center C of the wafer 110, and the direction of θ=0° matches one of the fifth directions V5. The protrusion amount H is the difference between the height of the edge of the semiconductor layer 120 and the height at a position separated 70 µm from the edge of the semiconductor layer 120 toward the center C. For example, FIGS. 12B and 12C are the measurement results of a surface roughness meter.

In the test example, the semiconductor layer 120 that included a gallium nitride semiconductor was epitaxially grown by MOCVD on the wafer 110 made of sapphire. The semiconductor layer 120 included an n-type semiconductor layer, a p-type semiconductor layer, and a light-emitting layer positioned between the n-type semiconductor layer and the p-type semiconductor layer. In the test example, a semiconductor layer was formed with conditions similar to those of the comparative example and the reference example described above. The average thickness of the semiconductor layer 120 formed on the wafer 10 was 10 µm.

In the semiconductor layer 120 as shown in FIG. 12B, an end portion 120b was thicker than other portions 120c.

As shown in FIG. 12C, the film thickness of the end portion of the semiconductor layer 120 has angle dependence; the protrusion amount H at the portion positioned in the fifth direction V5 when viewed from the center C was about 1.5 to 3 µm, and the protrusion amount H at the portion positioned in the first direction V1 was about 4 to 5 µm. In other words, the end portion in the first direction V1 was thicker than the end portion in the fifth direction V5.

Therefore, when the exterior form of the first region 211 is circular as in the reference example described above, the thick film portion 220a of the semiconductor layer 220 contacts the flat portion 232 of the support wafer 230, and bonding defects occur. It also may be considered to increase the width of a tilted portion 233 of the support wafer 230 so that the thick film portion 220a does not contact the flat portion 232. It also may be considered to make the wafer 210 larger than the support wafer 230 so that the thick film portion 220a does not contact the flat portion 232. However, the size and the configuration of the wafer are standardized; modifications of the wafer would require modifications of the specifications of the greater part of the processing apparatuses used to manufacture the semiconductor element, and the yield of the semiconductor element would undesirably decrease markedly. Also, there is a risk that the number of semiconductor elements per production unit that can be manufactured by the manufacturing processes at one time would be reduced.

Conversely, according to the first and second embodiments described above, a wafer of existing standards can be used, the occurrence of thick film portions in the semiconductor layer 20 can be suppressed while suppressing the propagation of cracks, and the semiconductor element can be manufactured with high yield.

The present disclosure can be utilized, for example, to manufacture a semiconductor element such as a light-emitting diode (LED), a laser diode (LD), etc.

What is claimed is:

1. A method for manufacturing a semiconductor element, the method comprising:
 providing a wafer comprising first and second regions at an upper surface of the wafer, the second region being located only at a periphery of the first region and being at a lower position than the first region; and forming a semiconductor layer made of a nitride semiconductor at the upper surface of the wafer, wherein:

in a top-view, the first region comprises an extension portion at an end portion of the first region in a first direction that passes through the center of the wafer parallel to an m-axis of the semiconductor layer, the extension portion extending in a direction from a center of the wafer toward an edge of the wafer, and the extension portion comprises a first side surface parallel to a third direction tilted at an angle not less than 5° and not more than 55° with respect to a second direction that is parallel to a tangent at an edge of the wafer in the first direction.

2. The method according to claim 1, wherein:
in the top view, the extension portion further comprises a second side surface extending in a fourth direction tilted at an angle not less than 5° and not more than 55° with respect to the second direction, the fourth direction being different from the third direction.

3. The method according to claim 2, wherein:
the second region is at a position not less than 2 μm lower than the first region.

4. The method according to claim 1, wherein:
the extension portion reaches an edge of the upper surface of the wafer.

5. The method according to claim 1, wherein:
in the top view, a tangent at an edge of the first region in a fifth direction that passes through the center of the wafer parallel to an a-axis of the semiconductor layer is parallel to a tangent at an edge of the wafer in the fifth direction.

6. The method according to claim 1, wherein: the wafer is made of sapphire.

7. The method according to claim 1, wherein:
the second region is at a position not less than 2 μm lower than the first region.

8. The method according to claim 1, wherein: a distance between the first region and an edge of the wafer in a fifth direction that is parallel to an a-axis of the semiconductor layer is not more than 1/10 of a diameter of the wafer.

9. The method according to claim 1, wherein:
the extension portions are located only at the end portion of the first region in the first direction.

10. The method according to claim 1, wherein:
the wafer has exactly one first region and exactly one second region at the upper surface of the wafer.

11. A method for manufacturing a semiconductor element, the method comprising:
providing a wafer comprising first and second regions at an upper surface of the wafer, the second region being located only at a periphery of the first region and being at a lower position than the first region; and forming a semiconductor layer made of a nitride semiconductor at the upper surface of the wafer, wherein:

in a top view, the second region comprises an extension portion at an end portion of the second region in a first direction that passes through the center of the wafer parallel to an m-axis of the semiconductor layer, the extension portion extending in a direction from an edge of the wafer toward a center of the wafer, and the extension portion comprises a first side surface parallel to a third direction tilted at an angle not less than 5° and not more than 55° with respect to a second direction that is parallel to a tangent at an edge of the wafer in the first direction.

12. The method according to claim 11, wherein:
in the top view, the extension portion further comprises a second side surface extending in a fourth direction tilted at an angle not less than 5° and not more than 55° with respect to the second direction, the fourth direction being different from the third direction.

13. The method according to claim 12, wherein:
the second region is at a position not less than 2 μm lower than the first region.

14. The method according to claim 12, wherein:
the first side surface and the second side surface are continuous.

15. The method according to claim 11, wherein:
in the top view, a tangent at an edge of the first region in a fifth direction that passes through the center of the wafer parallel to an a-axis of the semiconductor layer is parallel to a tangent at an edge of the wafer in the fifth direction.

16. The method according to claim 11, wherein:
the wafer is made of sapphire.

17. The method according to claim 11, wherein:
the second region is at a position not less than 2 μm lower than the first region.

18. The method according to claim 11, wherein:
a distance between the first region and an edge of the wafer in a fifth direction that is parallel to an a-axis of the semiconductor layer is not more than 1/10 of a diameter of the wafer.

19. The method according to claim 11, wherein:
the extension portions are located only at the end portion of the first region in the first direction.

20. The method according to claim 11, wherein:
the wafer has exactly one first region and exactly one second region at the upper surface of the wafer.

* * * * *